(12) United States Patent
Jeong (10) Patent No.: US 8,232,569 B2
(45) Date of Patent: Jul. 31, 2012

(54) SEMICONDUCTOR LIGHT EMITTING DEVICE

(75) Inventor: Hwan Hee Jeong, Ulsan (KR)

(73) Assignee: LG Innotek Co., Ltd., Seoul (KR)

( * ) Notice: Subject to any disclaimer, the term of this patent is extended or adjusted under 35 U.S.C. 154(b) by 278 days.

(21) Appl. No.: 12/624,853

(22) Filed: Nov. 24, 2009

(65) Prior Publication Data

US 2010/0127285 A1    May 27, 2010

(30) Foreign Application Priority Data

Nov. 25, 2008  (KR) ......................... 10-2008-0117581

(51) Int. Cl.
*H01L 33/00* (2010.01)
(52) U.S. Cl. ............................... 257/94; 257/98; 257/99
(58) Field of Classification Search ............. 257/94, 257/98, 99, E33.064, E33.005
See application file for complete search history.

(56) References Cited

U.S. PATENT DOCUMENTS

| | | | |
|---|---|---|---|
| 6,562,648 B1 | 5/2003 | Wong et al. | |
| 7,714,337 B2 * | 5/2010 | Kim et al. | ........................ 257/94 |
| 2007/0155032 A1 | 7/2007 | Kim et al. | |
| 2007/0194324 A1 | 8/2007 | Kim et al. | |
| 2008/0006842 A1 * | 1/2008 | Seong et al. | ..................... 257/99 |
| 2008/0054289 A1 * | 3/2008 | Tsai et al. | ........................ 257/99 |
| 2008/0061308 A1 | 3/2008 | Yoon | |
| 2009/0140281 A1 * | 6/2009 | Lee | ................................ 257/98 |
| 2010/0096660 A1 * | 4/2010 | Jeong | ............................. 257/99 |

FOREIGN PATENT DOCUMENTS

| | | |
|---|---|---|
| CN | 1971955 A | 5/2007 |
| CN | 101093870 A | 12/2007 |
| JP | 2002-076523 A | 3/2002 |
| KR | 10-2005-0013042 A | 2/2005 |
| KR | 10-0474820 B1 | 2/2005 |
| KR | 10-2005-0070459 A | 7/2005 |
| KR | 10-2005-0078661 A | 8/2005 |
| KR | 10-2005-0089120 A | 9/2005 |
| KR | 10-2006-0109378 A | 10/2006 |
| KR | 10-2008-0022818 | 3/2008 |

* cited by examiner

*Primary Examiner* — Phuc Dang (74) *Attorney, Agent, or Firm* — Birch, Stewart, Kolasch & Birch, LLP (57) ABSTRACT

A semiconductor light emitting device is provided. The semiconductor light emitting device comprises a conductive supporting member, an N-type semiconductor layer on the conductive supporting member; an active layer on the N-type semiconductor layer, a P-type semiconductor layer on the active layer, an ohmic contact layer on the P-type semiconductor layer, and an electrode on the ohmic contact layer.

15 Claims, 5 Drawing Sheets

SEMICONDUCTOR LIGHT EMITTING DEVICE

CROSS-REFERENCE TO RELATED APPLICATIONS

The present application claims priority under 35 U.S.C. 119 and 35 U.S.C. 365 to Korean Patent Application No. 10-2008-0117581 (filed on Nov. 25, 2008), which is hereby incorporated by reference in its entirety.

BACKGROUND

The present disclosure relates to a semiconductor light emitting device.

Due to excellent physical and chemical properties, Group III-V nitride semiconductors have been receiving much attention as a core material for light emitting devices such as Light Emitting Diodes (LEDs), Laser Diodes (LDs), and so forth. The Group III-V nitride semiconductor includes a semiconductor material having the empirical formula of $In_xAl_yGa_{1-x-y}N$ (0.x.1, 0.y.1, 0.x+y.1).

The LEDs are a kind of semiconductor device that converts electricity into infrared ray or light using the characteristics of a compound semiconductor to transmit and receive a signal, or is used as a light source.

The LEDs or LDs made of these nitride semiconductor materials are extensively adopted for light emitting devices in order to provide light, and are applied as a light source for various products such as a keypad's light emitting diode in a mobile phone, an electric sign board, and a lighting device.

SUMMARY

Embodiments provide a semiconductor light emitting device including a p-type semiconductor layer thereon and a conductive supporting member thereunder.

Embodiments provide a semiconductor light emitting device including an N-type semiconductor layer which an upper part is exposed around the N-type semiconductor layer.

An embodiment provides a semiconductor light emitting device comprising: a conductive supporting member; an N-type semiconductor layer on the conductive supporting member; an active layer on the N-type semiconductor layer; a P-type semiconductor layer on the active layer; an ohmic contact layer on the P-type semiconductor layer; and an electrode on the ohmic contact layer.

An embodiment provides a semiconductor light emitting device comprising: a reflective electrode layer; an N-type semiconductor layer on the reflective electrode layer; an active layer on the N-type semiconductor layer; a P-type semiconductor layer on the active layer; an ohmic contact layer on the P-type semiconductor layer; and a plurality of roughness formed on the ohmic contact layer, wherein the roughness is formed of a different material from the ohmic contact layer.

An embodiment provides a semiconductor light emitting device comprising: a reflective electrode layer; an N-type semiconductor layer including a first part formed on the reflective electrode layer and a second part formed on the first part, wherein a size of the second part is smaller than a size of the first part; an active layer on the second part of the N-type semiconductor layer; a P-type semiconductor layer on the active layer; an ohmic contact layer on the P-type semiconductor layer; a plurality of roughness formed on the ohmic contact layer and formed of a different material of the ohmic contact layer; and an electrode contacted with at least one of the ohmic contact layer and the P-type semiconductor layer.

The details of one or more embodiments are set forth in the accompanying drawings and the description below. Other features will be apparent from the description and drawings, and from the claims.

DETAILED DESCRIPTION OF THE EMBODIMENTS

Hereinafter, embodiments are described with reference to the accompanying drawings. During descriptions of the embodiments, the thickness of each layer in the drawing is just one example, and is not limited thereto. Additionally, the definition related to "on" or "under" of each layer will be described with reference to the accompanying drawings.

In the description of embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'. Further, the reference about 'on' and 'under' each layer will be made on the basis of drawings.

Figure 1:
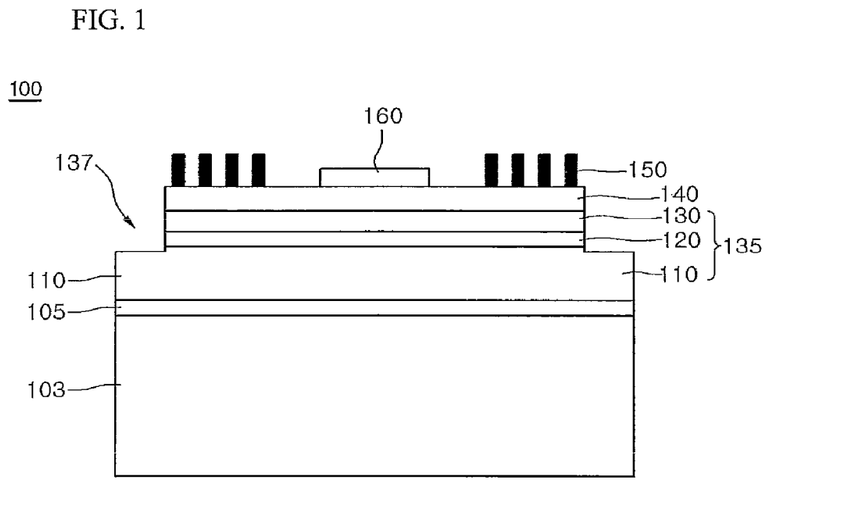
FIG. 1 is a sectional view of a semiconductor light emitting device according to an embodiment.

FIG. 1 is a sectional view of a semiconductor light emitting device according to an embodiment.

Referring to FIG. 1, a semiconductor light emitting device 100 includes a conductive supporting member 103, an electrode layer 105, an N-type semiconductor layer 110, an active layer 120, a P-type semiconductor layer 130, an ohmic contact layer 140, a roughness 150, and an electrode 160.

The conductive supporting member 103 serves as a base substrate, and may be realized using Cu, Au, Ni, Mo, Cu—W, or a carrier wafer formed of Si, Ge, GaAs, ZnO, SiC, $Ga_2O_3$, SiGe, and GaN. The conductive supporting member 103 may be formed using an electro plating method or may have a sheet form, but is not limited thereto. The thickness of the conductive supporting member 103 may be about 30 μm to about 150 μm, but is not limited thereto.

The electrode layer 105 is formed on the conductive supporting member 103. The N-type semiconductor 110 may be formed of at least one of materials having an excellent ohmic property and materials having high reflection and seed metal properties. For example, the material having an excellent ohmic property may be one of ITO, Cr, Ni, Ti, and Al. The material having a high reflection property may be one of Al, Ag, Pd, Rh, Pt, Ag—Cu, Ag—Pd—Cu, and Al—Cu. Additionally, the electrode layer 105 may be formed of one of ITO, Ir, Ru, Mg, Zn, Au, Hf, Cr, Ni, Ti, Al, Ag, Pd, Rh, Pt, Ag—Cu, Ag—Pd—Cu, Al—Cu, and a selective combination thereof.

The electrode layer 105 may serve as a reflection electrode layer, and reflects an incident light through the active layer 120.

The conductive supporting member 103 and the electrode layer 105 may be formed of one layer having a predetermined thickness and is not limited thereto.

An ohmic contact layer (not shown) may be formed on the electrode layer 105, and may be formed with a layer or a plurality of patterns. The ohmic contact layer includes at least one of Ni, Pd, Pt, indium tin oxide(ITO), indium zinc oxide (IZO), indium zinc tin oxide(IZTO), indium aluminum zinc oxide(IAZO), indium gallium zinc oxide(IGZO), indium gallium tin oxide(IGTO), aluminum zinc oxide(AZO), antimony tin oxide(ATO), gallium zinc oxide(GZO), IrOx, RuOx, RuOx/ITO, Ni/IrOx/Au, and Ni/IrOx/Au/ITO.

A layer or a pattern formed is formed between the electrode layer 105 and the N-type semiconductor layer 110, wherein the layer or pattern is formed of ITO, indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $SiO_2$, $Si_3N_4$, $SiO_x$, $SiN_x$, $Al_2O_3$ and $TiO_2$.

The N-type semiconductor layer 110 is formed on the electrode layer 105. The N-type semiconductor layer 110 may be formed of at least one of compound semiconductors including Group III-V elements doped with an N-type dopant such as GaN, InN, AlN, InGaN, AlGaN, InAlGaN, AlInN, AlGaAs, GaP, GaAs, GaAsP, and AlGaInP. Additionally, the N-type semiconductor layer 110 may have a single layer or multi-layer structure. The N-type dopant includes Si, Ge, Sn, Se, and Te.

The surface of an upper region 137 is exposed at the circumference of the N-type semiconductor layer 110 and has a Ga-Face region. The exposed Ga-Face surface of the N-type semiconductor layer 110 is thermally stable and provides a nonmetallic characteristic. The Ga-Face surface of the N-type semiconductor layer 110 may be formed of a Ga material more than an N material. The N-type semiconductor layer 110 is thicker than the P-type semiconductor layer 130.

The active layer 120 is formed on the N-type semiconductor layer 110, and may have a single or multi quantum well structure using a compound semiconductor layer of Group III-V elements. The active layer 120 uses InGaN well layer/GaN barrier layer as one period so that a single or multi quantum well structure can be formed. In the active layer 120, materials of a quantum well layer and a quantum barrier layer may vary depending on a light emitting material, but are not limited thereto. A clad layer may be on or/and under the active layer 120. The clad layer may be realized using an AlGaN series semiconductor.

The P-type semiconductor layer 130 is formed on the active layer 120. The P-type semiconductor layer 130 may be formed of at least one of compound semiconductors including Group III-V elements doped with a P-type dopant such as GaN, InN, AlN, InGaN, AlGaN, InAlGaN, AlInN, AlGaAs, GaP, GaAs, GaAsP, and AlGaInP. Additionally, the P-type semiconductor layer 130 may have a single layer or multi-layer structure. The P-type dopant includes Mg, Be, and Zn.

A light emitting structure 135 includes the N-type semiconductor 110, the active layer 120, and the P-type semiconductor layer 130. In the light emitting structure 135, the N-type semiconductor layer (not shown) may be formed on the P-type semiconductor layer 130.

The ohmic contact layer 140 is formed on the P-type semiconductor layer 130. The ohmic contact layer 140 may include a layer that ohmic-contacts the P-type semiconductor layer 130, or a single or a multi layer of a plurality of patterns. The ohmic contact layer 140 includes at least one of Ni, Pd, Pt, ITO, IZO, IZTO, IAZO, IGZO, IGTO, AZO, ATO, GZO, IrOx, RuOx, RuOx/ITO, Ni/IrOx/Au, and Ni/IrOx/Au/ITO.

The electrode 160 is formed on the ohmic contact layer 140, and may be formed on a portion of the P-type semiconductor layer 130 with a predetermined form and pattern. This form or pattern may include a current diffusion structure. The electrode 160 may be formed of one of Ag, Ag alloy, Ni, Al, Al alloy, Rh, Pd, Ir, Ru, Mg, Zn, Pt, Au, Hf, and an alloy thereof, but is not limited thereto.

The electrode 160 may contact the ohmic contact layer 140 or/and the P-type semiconductor layer 130. The electrode 160 is contact with at least two of the P-type semiconductor layer 130, the ohmic contact layer 140, and the roughness 150.

A roughness 150 may be formed on the ohmic contact layer 140, and may be formed of a material such as $Al_2O_3$ (n=1.7~0.1.8), $SiO_2$ (n=1.5~0.1.6), NaF (n=1.3~1.4), and MgO (n=1.735). The roughness 150 may be formed of a material having a lower refractive index than a refractive index of GaN (n=about 2.5) or ITO (n=2).

Additionally, an uneven shape of the roughness 150 such as a triangular shape, a rod shape, a pillar shape, a hemispheric shape, and a random shape is disposed with a circle, a polygon, a matrix, a stripe, and a random. The roughness 150 can improve light extraction efficiency by changing a critical angle of light or scattered reflecting light through a refractive index difference, which passes through the ohmic contact layer 145. Each of the roughness 150 is formed with a thickness of more than a predetermined value (for example, about 1.0 μm) and also with a regular or irregular micro-interval (for example, about 0.5 μm to about 5 μm).

FIGS. 2 to 11 are views illustrating processes of manufacturing a semiconductor light emitting device according to an embodiment.

Figure 2:
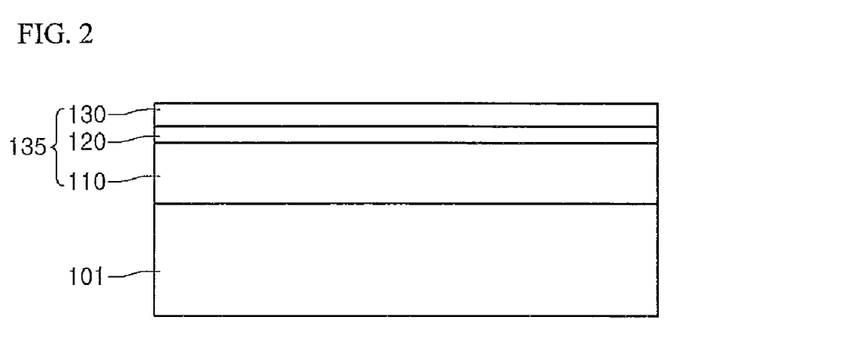
FIGS. 2 to 11 are views illustrating processes of manufacturing a semiconductor light emitting device according to an embodiment.

Referring to FIG. 2, a growth substrate 101 is loaded on growth equipment, and a compound semiconductor layer of Group II to VI elements is formed thereon.

The growth equipment may include an electron beam evaporator, equipment for physical vapor deposition (PVD), equipment for chemical vapor deposition (CVD), equipment for plasma laser deposition (PLD), a dual-type thermal evaporator, equipment for sputtering, and equipment for metal organic chemical vapor deposition (MOCVD), but is not limited thereto.

The growth substrate 101 may include $Al_2O_3$, GaN, SiC, ZnO, Si, GaP, InP, $Ga_2O_3$, a conductive material, or GaAs. An uneven pattern may be formed on the growth substrate 101. Additionally, a layer or a pattern using a compound semiconductor including Group II to VI elements, for example, at least one of a ZnO layer (not shown), a buffer layer (not shown), and an undoped semiconductor layer (not shown) may be formed on the growth substrate 101.

The buffer layer and the updoped semiconductor layer may be formed of using a compound semiconductor of Group III-V elements. The buffer layer reduces a lattice constant difference with respect to the substrate 101. The undoped semiconductor layer may be formed of an undoped GaN series semiconductor.

A light emitting structure 135 including a plurality of compound semiconductor layers is formed on the substrate 101. The light emitting structure 135 includes an N-type semiconductor layer 110, an active layer 120, and a P-type semiconductor layer 130.

The N-type semiconductor layer 110 is formed on the substrate 101. The N-type semiconductor layer 110 may include a compound semiconductor of Group III-V such as GaN, InN, AlN, InGaN, AlGaN, InAlGaN, AlInN, AlGaAs, GaP, GaAs, GaAsP, and AlGaInP, and may be a single or multi layer. The N-type semiconductor layer 110 may be doped with an N-type dopant (for example, Si, Ge, Sn, Se, and Te).

The active layer 120 is formed on the N-type semiconductor layer 110, and may have a single or multi quantum well structure using a compound semiconductor layer of Group III-V. The active layer 120 is formed using InGaN well layer/GaN barrier layer as one period, and have a single or multi quantum well structure. The active layer 120 may have respectively different materials of the quantum well layer and the quantum barrier layer depending on a light emitting material, but is not limited thereto. A clad layer may be formed on or/and under the active layer 120, and may be formed of an AlGaN series semiconductor.

The P-type semiconductor layer 130 is formed on the active layer 120. The P-type semiconductor layer 130 may selectively include a compound semiconductor layer including Group III-V elements doped with a P-type dopant such as GaN, InN, AlN, InGaN, AlGaN, InAlGaN, AlInN, AlGaAs, GaP, GaAs, GaAsP, and AlGaInP, and may have a single or multi structure. The P-type dopant may include Mg, Be, and Zn.

An N-type semiconductor layer (not shown) may be formed on the P-type semiconductor layer 130. The light emitting structure 135 may include the N-type semiconductor layer on the P-type semiconductor layer 130.

Figure 3:
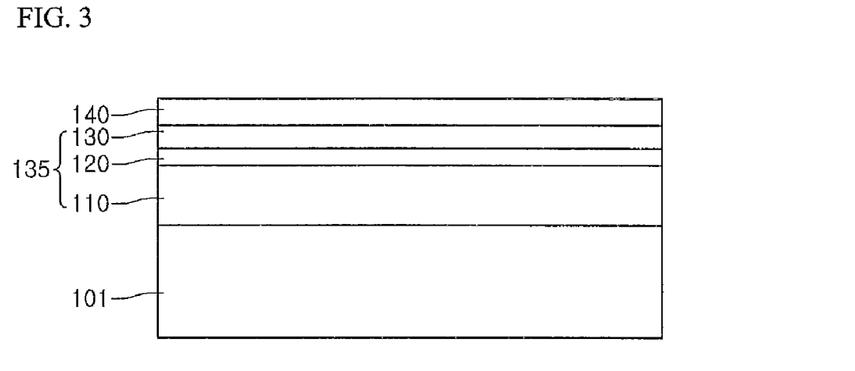

Referring to FIG. 3, the ohmic contact layer 140 is formed on the P-type semiconductor layer 130. The ohmic contact layer 140 may include a layer that ohmic-contacts the P-type semiconductor layer 130, or a single or multi layer of a plurality of patterns. The ohmic contact layer 140 includes at least one of Ni, Pd, Pt, ITO, IZO, IZTO, IAZO, IGZO, IGTO, AZO, ATO, GZO, IrOx, RuOx, RuOx/ITO, Ni/IrOx/Au, and Ni/IrOx/Au/ITO.

Figure 4:
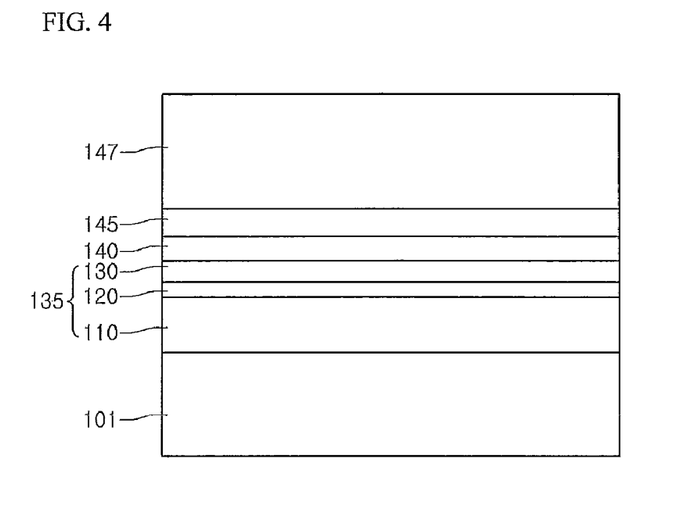

Referring to FIG. 4, a seed metal layer 145 is formed on the ohmic contact layer 140. The seed metal layer 145 may be formed of a layer or a plurality of patterns, and may selectively include Ni/Cu, Cr/Cu, and Ti/Cu. The seed metal layer 145 is formed through a plating process.

A sacrificial substrate 147 is formed on the seed metal layer 145. The sacrificial substrate 147 is a temporary substrate, and is formed of a plated metal such as copper or gold. Its thickness may be about 30 μm to about 100 μm, but is not limited thereto. Additionally, the sacrificial substrate 147 may be attached using a conductive sheet, and in this case, the seed metal layer 145 may not be formed.

Figure 5:
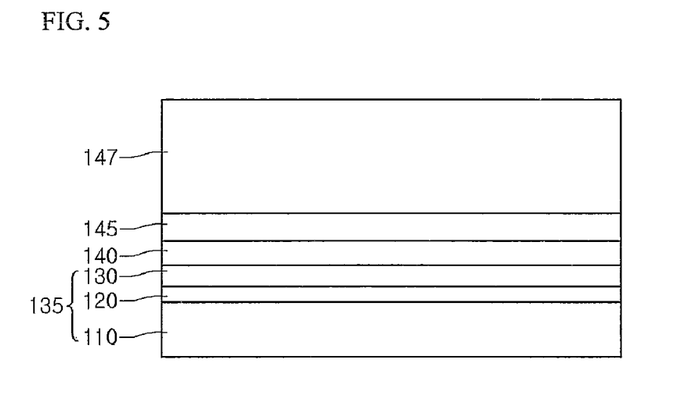

Referring to FIGS. 4 and 5, once the sacrificial substrate 147 is formed, it is positioned on a base substrate and then the growth substrate 101 is removed.

The growth substrate 101 may be removed through a physical or/and chemical removing method. The physical removing method separates the substrate 101 by a Laser Lift Off (LLO) process for projecting a laser on the substrate 101 with a wavelength of a predetermined region. The chemical removing method removes a buffer layer to separate the substrate 101 using a wet etchant when there is another semiconductor layer (for example, the buffer layer) between the substrate 101 and the first conductive semiconductor layer 110. The removing method of the growth substrate 101 is not limited to the above.

A etching process using Inductively coupled Plasma/Reactive Ion Etching (ICP/RIE) may be performed on the surface of the N-type semiconductor layer 110 where the growth substrate 101 is removed.

Figure 6:
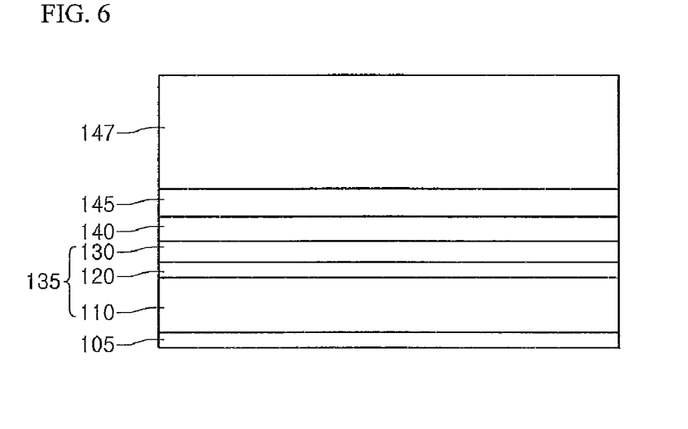

Referring to FIG. 6, an electrode layer 105 is formed under the N-type semiconductor layer 105. The electrode layer 105 ohmic-contacts the N-type semiconductor layer 110 and may be formed of at least one of materials having high reflection and seed metal characteristics. For example, a material having an excellent ohmic characteristic may include ITO, Cr, Ni, Ti, and Al. A material having an high reflection characteristic may include ITO, Ir, Ru, Mg, Zn, Au, Hf, Cr, Ni, Ti, Al, Ag, Pd, Rh, Pt, Ag—Cu, Ag—Pd—Cu, Al—Cu, and a selective combination thereof.

An ohmic contact layer (not shown) may be formed between the N-type semiconductor layer 110 and the electrode layer 105. The ohmic contact layer may be formed of a layer or a plurality of patterns. The ohmic contact layer may include at least one of Ni, Pd, Pt, ITO, IZO, IZTO, IAZO, IGZO, IGTO, AZO, ATO, GZO, IrOx, RuOx, RuOx/ITO, Ni/IrOx/Au, and Ni/IrOx/Au/ITO. The electrode layer 105 may serve as a reflection electrode layer.

Figure 7:
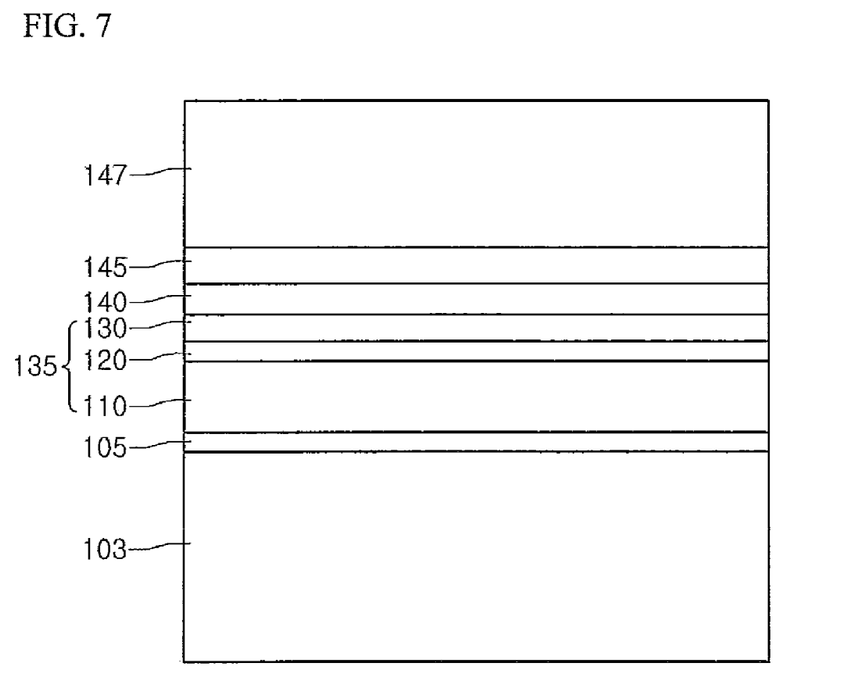

Referring to FIG. 7, a conductive supporting member 103 is formed under the electrode layer 105 through a plating process. Additionally, the conductive supporting member 103 may include Cu, Au, Ni, Mo, Cu—W, or a carrier wafer formed of Si, Ge, GaAs, ZnO, SiC, Ga$_2$O$_3$, SiGe, and GaN. The conductive supporting member 103 may be formed through an electro-plating method or with a sheet form, but is not limited thereto. The thickness of the conductive supporting member 103 may be about 30 μm to about 150 μm, but is not limited thereto. The conductive supporting member 104 serves as a base substrate.

The conductive supporting member 103 and the electrode layer 105 may be formed of one layer having a predetermined thickness, and are not limited thereto.

Figure 8:
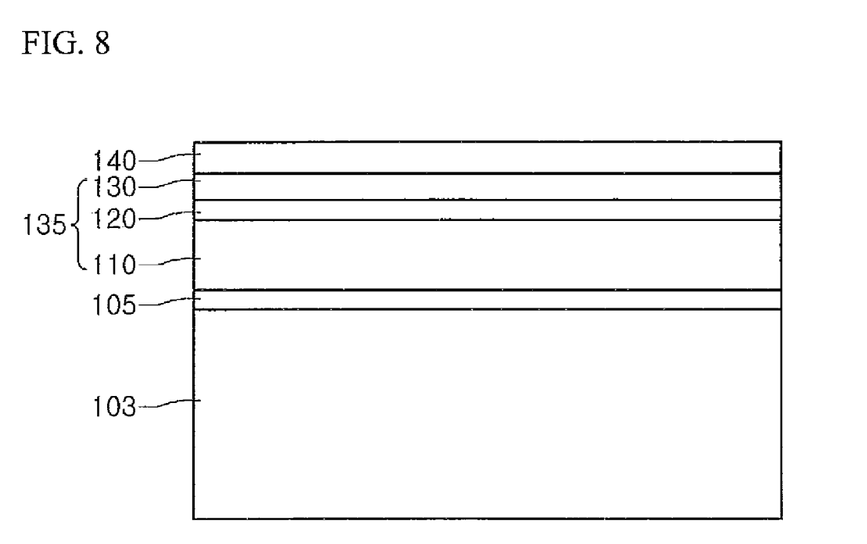
Figure 9:
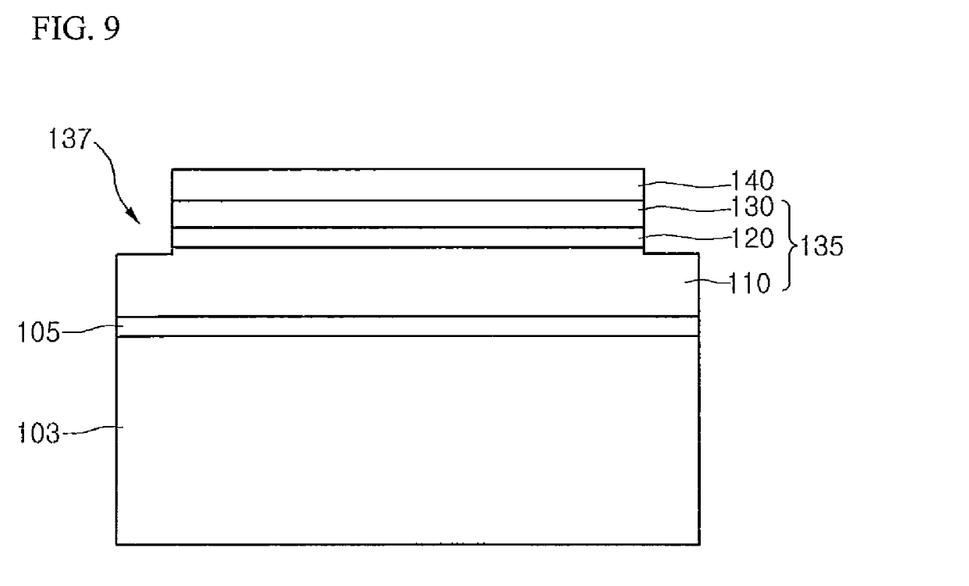

Referring to FIGS. 7 to 9, the sacrificial substrate 147 is removed. The sacrificial substrate 147 may be removed through a wet or dry etching method or a polishing method, but is not limited thereto.

Once the sacrificial substrate 147 is removed, the seed metal layer 145 is removed. The seed metal layer 145 may be removed through a wet or/and dry etching method or a polishing method, but is not limited thereto.

Here, an interlayer delamination phenomenon can be resolved by removing the sacrificial substrate 147. That is, during a process (for example, an LLO process) for removing the growth substrate 101, a predetermined impact may be applied between the sacrificial substrate 147 and the ohmic contact layer 140 using a laser. In this case, an unstable delamination phenomenon may exist between the inner layers of the device. Accordingly, by removing the sacrificial substrate 147, the delamination phenomenon between the inner layers of the device can be prevented.

Once the sacrificial substrate 147 is removed, mesa etching is performed on a chip boundary region by using a mask pattern on the ohmic contact layer 140.

The isolation etching process is performed until the ohmic contact layer 140, the P-type semiconductor layer 130, the active layer 120, and the N-type semiconductor layer 110 are exposed. The depth of the isolation etching is under about 1.0 μm or may be etched until the N-type semiconductor layer 110 is exposed.

Accordingly, the upper surface of the N-type semiconductor layer 110 is exposed around the circumference of the light emitting structure 135.

Ga-Face is exposed at the upper region 137 around the circumference of the N-type semiconductor layer 110. At this point, since Ga-Face exposed at the N-type semiconductor layer 110 is a nonmetal having a lower operation voltage, it is thermally stable compared to N-Face, and also prevents a short circuit with other layers when an external impact is applied to the sidewall of the light emitting structure.

The active layer 120 is spaced apart from the conductive support member 103 by the upper region 137 of the N-type semiconductor layer 110.

Figure 10:
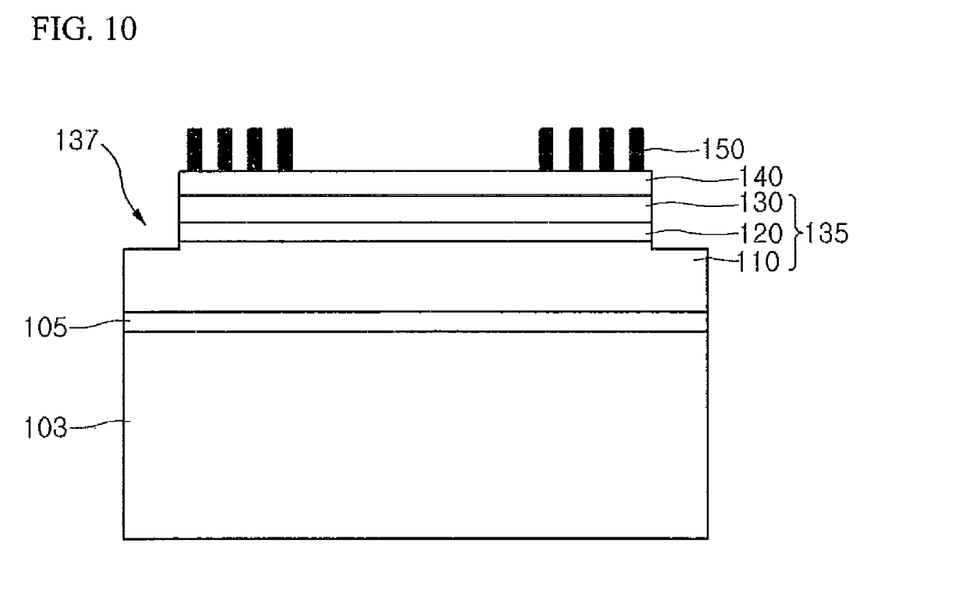
Figure 11:
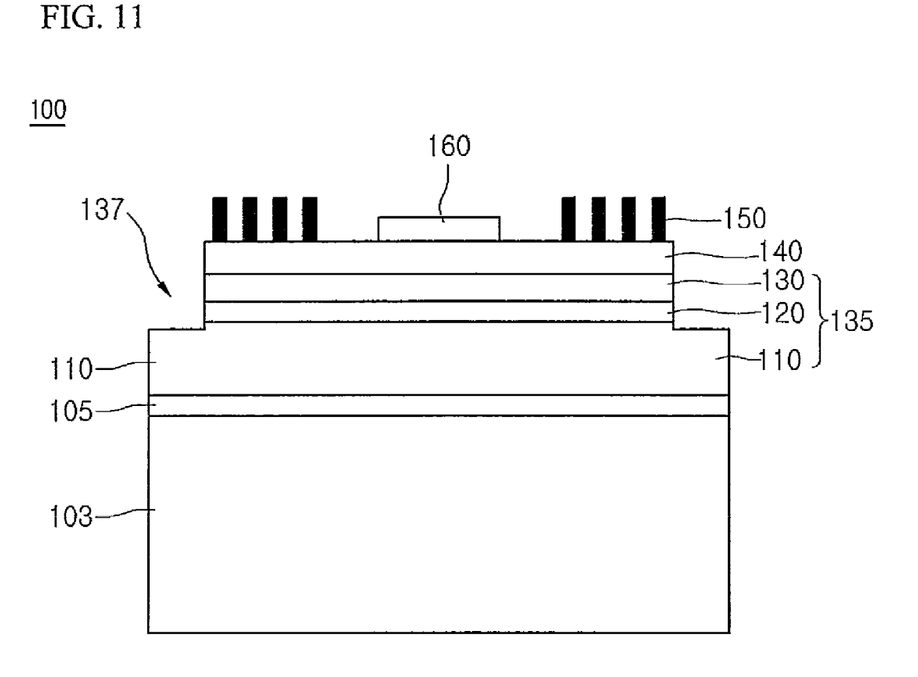

Referring to FIGS. 10 and 11, a roughness 150 is formed on the ohmic contact layer 140. The roughness 150 may grow using a mask pattern or through sputtering equipment. The roughness 150 may be formed of a material having a high refractive index such as Al$_2$O$_3$, SiO$_2$, NaF, and MgO. The roughness 150 may be formed of a material having a lower refractive index than GaN. Its pattern such as a triangular shape, a rod shape, a pillar shape, a hemispheric shape, and a random shape is disposed with a circle, a polygon, a matrix, a stripe, and a random through processes such as a wet etching, dry etching, or photoresist off process. Each of the roughness 150 is formed with a thickness of more than a predetermined value (for example, about 1.0 μm) and also with a regular or irregular micro-interval (for example, about 0.5 μm to about 5 μm).

The roughness 150 can compensate for optical extraction through a structure corresponding to a related art N-type roughness pattern, and may not be formed.

An electrode 160 is formed on a portion of the ohmic contact layer 140. The electrode 160 may be formed of one of Ag, Ag alloy, Ni, Al, Al alloy, Rh, Pd, Ir, Ru, Mg, Zn, Pt, Au, and Hf, and an alloy thereof, but is not limited thereto. The electrode 160 may contact the ohmic contact layer 140 or/and the P-type semiconductor layer 130. The electrode 160 is contact with at least two of the P-type semiconductor layer 130, the ohmic contact layer 140, and the roughness 150.

Embodiments provide the vertical semiconductor light emitting device 100 having the P-type semiconductor layer 130 thereon, and exposing the Ga-Face surface around the circumference of the light emitting structure 135. Therefore, short circuit due to manufacturing processes can be prevented.

Embodiments provide a thermally-stable vertical semiconductor light emitting device.

Embodiments improve the reliability of an LED chip by performing mesa etching with the depth exposing an upper part of an N-type semiconductor layer.

Embodiments provide a vertical semiconductor light emitting device having a P-type semiconductor layer thereon, and exposing an upper part around the circumference of an N-type semiconductor layer disposed on a conductive support member. Therefore, short circuit due to manufacturing processes can be prevented.

When a nitride semiconductor layer is removed through an LLO method, embodiments prevent a delamination phenomenon where a layer contacting the nitride semiconductor layer is delaminated due to an external impact.

An embodiment provides a method of manufacturing a semiconductor light emitting device that comprises forming an N-type semiconductor layer, an active layer and a P-type semiconductor on a growth substrate; forming a ohmic contact layer on the P-type semiconductor layer; forming a sacrificial substrate on the ohmic contact layer and removing the growth substrate; forming a conductive supporting member under the N-type semiconductor layer and removing the sacrificial substrate; and forming an electrode on the ohmic contact layer.

Embodiments provide a vertical semiconductor light emitting device having an N-type semiconductor layer as a top layer).

Embodiments improve the reliability of a vertical semiconductor light emitting device.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising:
a conductive supporting member;
an N-type semiconductor layer on the conductive supporting member;
an active layer on the N-type semiconductor layer;
a P-type semiconductor layer on the active layer;
an ohmic contact layer on the P-type semiconductor layer; and
an electrode on the ohmic contact layer,
wherein the N-type semiconductor layer comprises an upper part exposed around its outer circumference, and
wherein the upper part of the N-type semiconductor layer includes a Ga-Face surface.

2. The semiconductor light emitting device according to claim 1, comprising an electrode layer between the conductive supporting member and the N-type semiconductor layer.

3. The semiconductor light emitting device according to claim 2, wherein the electrode layer comprises one of indium tin oxide(ITO), Ir, Ru, Mg, Zn, Au, Hf, Cr, Ni, Ti, Al, Ag, Pd, Rh, Pt, Ag—Cu, Ag—Pd—Cu, and Al—Cu, or a selective combination thereof.

4. The semiconductor light emitting device according to claim 1, wherein the ohmic contact layer comprises at least one layer or a pattern.

5. The semiconductor light emitting device according to claim 1, comprising a plurality of roughness on the ohmic contact layer.

6. The semiconductor light emitting device according to claim 2, wherein the electrode layer is a reflection electrode layer and comprise an ohmic contact layer having at least one layer or a plurality of patterns between the electrode layer and the N-type semiconductor layer.

7. The semiconductor light emitting device according to claim 5, wherein the roughness comprises at least one of $Al_2O_3$, $SiO_2$, NaF, and MgO.

8. The semiconductor light emitting device according to claim 5, the roughness has a thickness of about 1.0 μm and an interval of less than about 5 μm.

9. A semiconductor light emitting device comprising:
a reflective electrode layer;
an N-type semiconductor layer on the reflective electrode layer;
an active layer on the N-type semiconductor layer;
a P-type semiconductor layer on the active layer;
an ohmic contact layer on the P-type semiconductor layer; and
a plurality of roughness formed on the ohmic contact layer,
wherein the roughness is formed of a different material from the ohmic contact layer, and
wherein the N-type semiconductor layer includes a Ga-Face surface exposed around a circumference of the N-type semiconductor layer.

10. The semiconductor light emitting device according to claim 9, comprising a conductive supporting member under the reflective electrode layer,
wherein the conductive supporting member and the reflective electrode layer are formed of a metal material.

11. The semiconductor light emitting device according to claim 9, which a thickness of the N-type semiconductor layer is thicker than a thickness of the P-type semiconductor layer.

12. The semiconductor light emitting device according to claim 9, a layer or a pattern formed between the reflective electrode layer and the N-type semiconductor layer, wherein the layer or the pattern is formed of at least one of ITO, indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $SiO_2$, $Si_3N_4$, $SiO_x$, $SiN_x$, $Al_2O_3$ and $TiO_2$.

13. The semiconductor light emitting device according to claim 9, wherein the roughness has at least one of a triangular form, a pole form, and a hemispheric form.

14. The semiconductor light emitting device according to claim 13, wherein a reflective index of the roughness is formed of a material with a reflection index less than of the GaN or the ohmic contact layer and comprises at least one of $Al_2O_3$, $SiO_2$, NaF, and MgO.

15. The semiconductor light emitting device according to claim 9, comprising a semiconductor layer including an n-type dopant between the P-type semiconductor layer and the ohmic contact layer.

* * * * *